United States Patent
Wu et al.

(10) Patent No.: US 6,335,274 B1
(45) Date of Patent: Jan. 1, 2002

(54) METHOD FOR FORMING A HIGH-RI OXIDE FILM TO REDUCE FLUORINE DIFFUSION IN HDP FSG PROCESS

(75) Inventors: Shu-Li Wu, Nan-Tao; Pei-Ren Jeng, Hsin-Chu, both of (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/714,128

(22) Filed: Nov. 17, 2000

(51) Int. Cl.[7] ................................................ H01L 21/4763
(52) U.S. Cl. ............................................. 438/626; 438/631
(58) Field of Search ................................ 438/783, 740, 438/624, 424, 623, 626, 631

(56) References Cited

U.S. PATENT DOCUMENTS 6,008,120 A  * 12/1999  Lee ................................ 438/634
6,149,987 A  * 11/2000  Perng et al. .................. 427/579
6,217,658 B1 *  4/2001  Orezyl et al. ................ 118/697

* cited by examiner

*Primary Examiner*—David Nelms
*Assistant Examiner*—Thao P. Le

(57) ABSTRACT

A method for forming a high-RI dielectric liner layer to prevent out diffusion of fluorine substances in an intermetal dielectric (IMD) layer of an semiconductor device is provided. The method comprises following steps. First, a patterned conductive layer is deposited on a substrate. Then, a dielectric liner layer is formed by high density plasma enhanced chemical vapor deposition method or plasma enhanced chemical vapor deposition method. The dielectric liner layer is silicon dioxide and has a high-RI between about 1.5 to 1.8. Next, a fluorinated silicate glass layer is deposited on the dielectric liner layer. The high-RI dielectric liner layer is used to reduce out diffusion of fluorine substances in the fluorinated silicate glass layer. Last, it is proceeded a chemical mechanism polishing process to remove additional fluorinated silicate glass layer and the dielectric liner layer.

38 Claims, 3 Drawing Sheets

METHOD FOR FORMING A HIGH-RI OXIDE FILM TO REDUCE FLUORINE DIFFUSION IN HDP FSG PROCESS

BACKGROUND OF THE INVENTION

1. Field of the Invention

The present invention generally relates to a fabrication method of integrated circuits, and more particularly to a high-reflectivity index (RI) oxide film to reduce fluorine substances out diffusion from High Density Plasma enhanced Chemical Vapor Deposition (HDP-CVD) Fluorinated Silicate Glass (FSG).

2. Description of the Prior Art

In the fabrication of microelectronic semiconductor devices on a wafer substrate, such as silicon, to form an integrated circuit, various metal layers and insulation layers are deposited thereon in selective sequence. The insulation layers, e.g., of silicon dioxide, silicon oxynitride ($SiO_xN_y$), fluorinated silicate glass (FSG), also called fluorinated silicon oxide, spin-on glass (SOG), etc., serve as electrical insulation between metal layers, e.g., intermetal dielectric (IMD) layers, as protective layers, as gap filling layers to achieve planarization (layer flatness) in the wafer substrate, and the like, as the case may be. The individual layers are deposited by conventional technique such as plasma enhanced chemical vapor deposition (PECVD), atmospheric pressure CVD, etc.

Fluorinated silicate glass (FSG) is one of the favorable low dielectric materials used for intermetal dielectric (IMD) in connection with metallization techniques before so-called back end of the line operations. To deposit FSG, for example, either high density plasma enhanced chemical vapor deposition (HPD-CVD) is used extensively.

The dielectric constant achievable for FSG is about 3.3 depending on the fluorine concentration in the FSG film and the precursor used to deposit the FSG film. A higher fluorine concentration usually provides a lower dielectric constant. However, a higher fluorine concentration makes the film unstable because free fluorine tends to diffuse or migrate out of the film to adjacent layers in the IC.

Out diffusion of fluorine substances (including fluorine itself and attendant self-generating contaminant compounds thereof with other contaminating precursor constituents) from FSG can create bubbles that collect at interfaces with metal layers, resulting in metal peeling problems due to corrosion or poisoning, and the like. In many cases, the use of FSG is combined with post plasma treatment, e.g., plasma treatment using oxygen and nitrogen or nitrous oxide ($N_2O$), or the inclusion of a silicon dioxide cap layer to minimize fluorine substances out diffusion. However, fluorine substances, including fluorine itself, will diffuse well into silicon dioxide films and the diffusion length (penetration depth) thereof can be in excess of several thousand angstroms.

It is desirable to have an arrangement of FSG as an IMD layer in a semiconductor device in which out diffusion of fluorine substances is prevented so as to avoid metal peeling problems, especially if this is attained essentially without increasing the manufacturing costs.

SUMMARY OF THE INVENTION

It is an object of the invention that a high-RI silicon dioxide dielectric liner layer can reduce out diffusion of fluorine substances in FSG layer.

In accordance with the present invention, a method is provided comprising following steps. First, a conductive layer is deposited on a substrate, wherein the conductive layer is patterned on the substrate. Then, a dielectric liner layer is formed by high density plasma enhanced chemical vapor deposition method or plasma enhanced chemical vapor deposition method on the substrate and the conductive layer. The dielectric liner is silicon dioxide and has a high-RI between about 1.5 to 1.8. Next, a fluorinated silicate glass layer is deposited on the dielectric liner layer. The high-RI dielectric liner layer is used to reduce out diffusion of fluorine substances in the fluorinated silicate glass layer. Last, it is proceeded a chemical mechanism polishing process to remove additional fluorinated silicate glass layer and the dielectric liner layer.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The semiconductor devices of the present invention are applicable to a broad rang of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Further, while the present invention is illustrated by a number of preferred embodiments directed to silicon semiconductor devices, it is not intended that illustrations be a limitation on the scope or applicability of the present invention. Further, while the illustrative examples use insulated gate control structures, it should be recognized that the insulated gate portions may be replaced with light activated or current activated structure(s). Thus, it is not intended that the structures illustrated. These devices are included to demonstrate the utility and application of the present invention to presently preferred embodiments.

Moreover, various parts of the semiconductor elements have not been drawn to scale. Certain dimensions have exaggerated in relation to other dimensions in order to provide a clearer illustration and understanding of the present invention. For the purposes of illustration the preferred embodiment of the semiconductor devices of the present invention have been shown to include specific P and N type regions, but it should be clearly understood that the teachings herein are equally applicable to semiconductor devices in which the conductivities of the various regions have been reversed, for example, to provide the dual of the illustrated device. Enhancement and depletion mode structures may be similarly interchanged.

Moreover, although the embodiments illustrated herein are show in two-dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

This invention utilizes a high-RI dielectric liner layer for the intermetal dielectric layer, such as the fluorinated silicide glass layer, to reduce out diffusion of fluorine substances in the fluorinated silicide glass layer.

Figure 1:
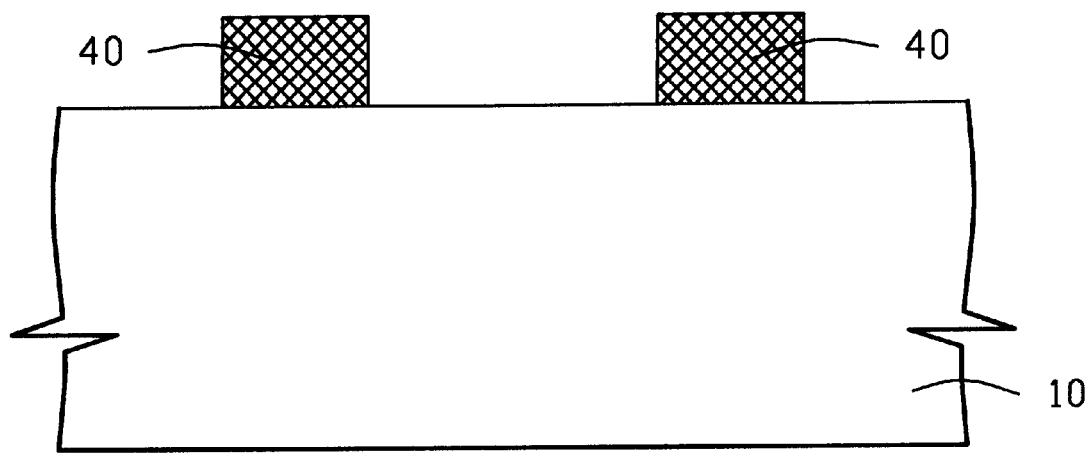
FIG. 1 is the schematic representation of the structure at various stages during the formulation of an intermetal dielectric (IMD) layer of an semiconductor device, in accordance with the present invention.

Referring to FIG. 1, a substrate 10 is provided and a conductive layer 40 is deposited thereon. The conductive layer 40 is patterned on the substrate 10. The conductive layer 40 is made by metal, such as aluminium, and is used as interconnects.

Figure 2:
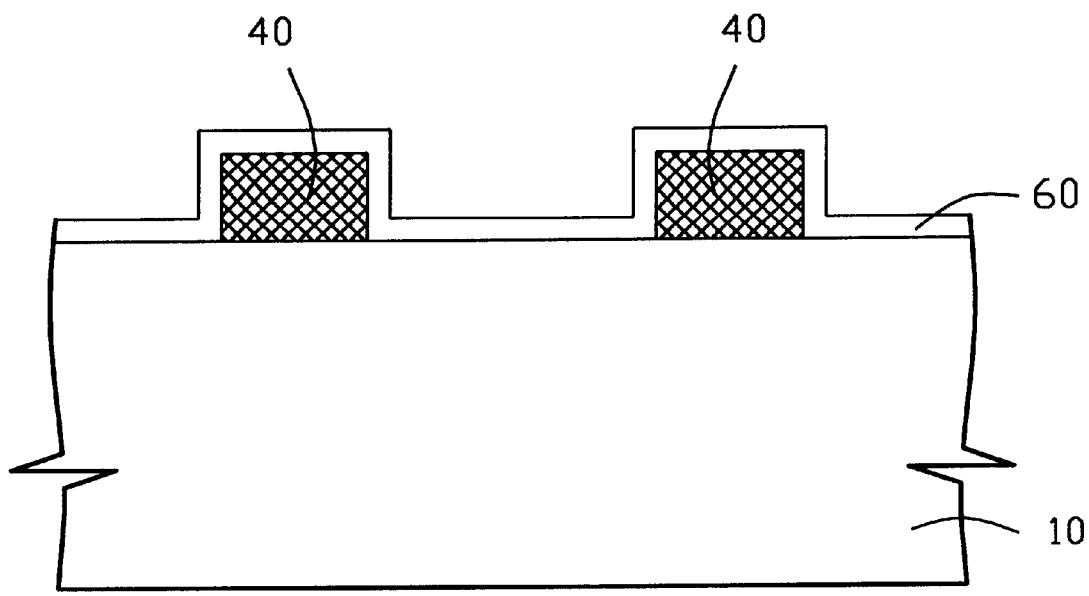
FIG. 2 is the schematic representation of the structure at various stages during the formulation of an intermetal dielectric (IMD) layer of an semiconductor device, in accordance with the present invention.

Referring to FIG. 2, a dielectric liner layer 60 is formed on the conductive layer 40 and the substrate 10. The dielectric layer 60 is silicon dioxide and formed by using conventional high density plasma enhanced chemical vapor deposition method. The dielectric layer 60 is in a thickness of between about 150 to 300 angstroms and used to prevent from out diffusion of fluorine substances. The dielectric layer 60 can protect the conductive layer 40 not corrosion or poisoning by fluorine substances.

Because fluorine substances can diffuse well into silicon dioxide films, so the dielectric liner layer 60 used in the present invention has a high-RI between about 1.55 to 1.8. The high-RI dielectric liner layer 60 can effectually reduce out diffusion fluorine substances. The dielectric liner layer 60 has a better performance when the RI is above 1.6. The dielectric layer 60 is formed by using conventional high density plasma enhanced chemical vapor deposition method or plasma enhanced chemical vapor deposition method. The high density plasma enhanced chemical vapor deposition method is using decomposition of a mixture of precursors oxygen ($O_2$) and silane ($SiH_4$). The ratio of the mixture of oxygen ($O_2$) and silane ($SiH_4$) is about 0.2 to 1.5. Further, the high density plasma enhanced chemical vapor deposition method is performed on a pressure in range from 0.5 to 2.5 torr and at a temperature between about 300 to 500° C. The radio frequency power used here is in range from 150 to 500 Watt. The plasma enhanced chemical vapor deposition method is using decomposition of a mixture of precursors silane ($SiH_4$) and nitrous oxide ($N_2O$). The ratio of the mixture of silane ($SiH_4$) and nitrous oxide ($N_2O$) is about 0.05 to 1.5. Further, the plasma enhanced chemical vapor deposition method is performed on a pressure in range from 0.5 to 5.5 torr and at a temperature between about 300 to 500° C. The radio frequency power used here is in range from 50 to 1000 Watt.

Figure 3:
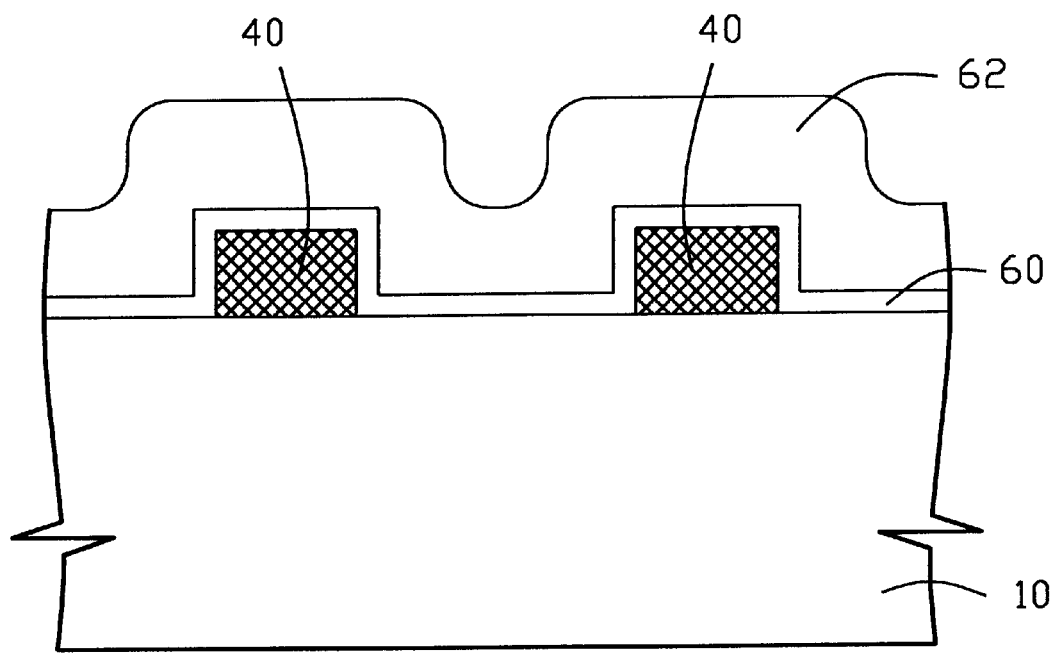
FIG. 3 is the schematic representation of the structure at various stages during the formulation of an intermetal dielectric (IMD) layer of an semiconductor device, in accordance with the present invention.

Referring to FIG. 3, an intermetal dielectric layer 62 is deposited on the dielectric liner layer 60. The intermetal dielectric layer 62 is fluorinated silicide glass and has a low dielectric constant. The dielectric constant of the fluorinated silicide glass layer 62 depends on the fluorine concentration of the fluorinated silicide glass. Because the dielectric liner layer 60 can effectually reduce out diffusion of fluorine substances in the fluorinated silicide glass layer 62, so the intermetal dielectric layer 62 can retain its characteristic of low dielectric constant. No matter the barrier layer is formed by using conventional high density plasma enhanced chemical vapor deposition method or plasma enhanced chemical vapor deposition method, the film property of the high-RI barrier layer is silicon-rich. Moreover, these excess silicon atoms in the film are existing as the silicon-hydrogen bonding (Si-H) and can effectively reduce out diffusion of fluorine substances.

Figure 4:
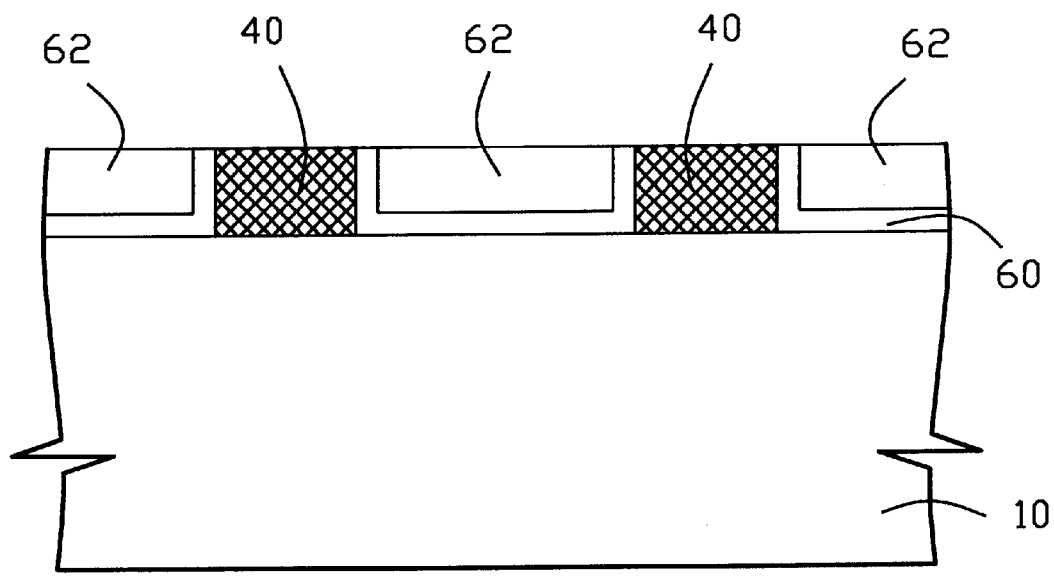
FIG. 4 is the schematic representation of the structure at various stages during the formulation of an intermetal dielectric (IMD) layer of an semiconductor device, in accordance with the present invention.

Referring to FIG. 4, it is proceeded a planarizing process to remove additional fluorinated silicate glass layer 62 and the dielectric liner layer 60. The planarizing process comprises a chemical mechanism polishing process.

Figure 5:
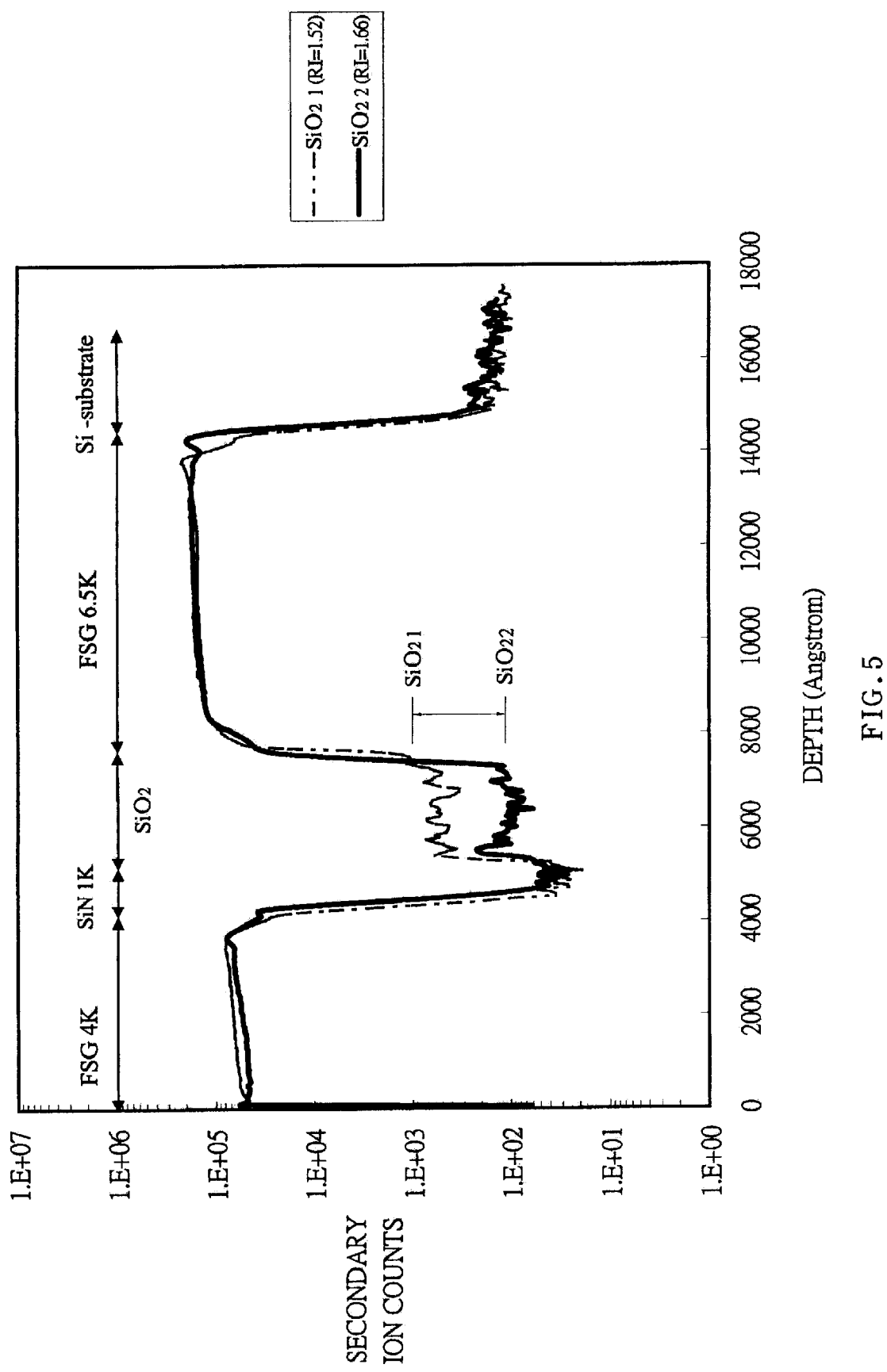
FIG. 5 is one result of the present invention that the high-RI dielectric liner layer can effectively prevent fluorine substances out diffusion from the fluorinated silicate glass layer.

Referring to FIG. 5, it is a result of the invention that using high-RI dielectric liner layer can effectively reduce out diffusion of fluorine substances in fluorinated silicide glass layer. In this experiment, it used two silicon dioxide layers having different RI to compare the count of out diffusion of fluorine substances in the fluorinated silicide glass layer. The RI of a first silicon dioxide layer is about 1.52. The detection of the secondary ion counts in the fluorinated silicide glass layer and the first silicon dioxide layer is about 1.E+05 and 1.E+03. The RI of a second silicon dioxide layer is about 1.66. The detection of the secondary ion counts in the fluorinated silicide glass layer and the second silicon dioxide layer is about 1.E+05 and 1.E+02. Comparing the first silicon dioxide layer and the second silicon dioxide layer, the second silicon dioxide layer has fewer ions, that means the second silicon dioxide layer which has a high RI provides a better barrier to hinder fluorine substances out diffusion.

Of course, it is to be understood that the invention need not be limited to these disclosed embodiments. Various modification and similar changes are still possible within the spirit of this invention. In this way, the scope of this invention should be defined by the appended claims.

What is claimed is:

1. A method for forming an intermetal dielectric (IMD) layer of an semiconductor device, said method comprises:

providing a substrate;

depositing a conductive layer on said substrate;

forming a dielectric liner layer on said conductive layer, wherein said dielectric liner layer has a high reflectivity index (RI) between about 1.55 to 1.8;

depositing a fluorinated silicate glass layer on said dielectric liner layer; and planarizing said fluorinated silicate glass layer and said dielectric liner layer until a top surface of said conductive layer is reached.

2. The method according to claim 1, wherein said conductive layer is patterned on said substrate.

3. The method according to claim 1, wherein said dielectric liner layer is silicon dioxide.

4. The method according to claim 1, wherein a preferred value of said RI is above 1.6.

5. The method according to claim 1, wherein said dielectric liner layer is formed by a high density plasma enhanced chemical vapor depositing process.

6. The method according to claim 5, wherein said high density plasma enhanced chemical vapor depositing process using decomposition of a mixture of precursors oxygen ($O_2$) and silane ($SiH_4$) which the ratio is about 0.2 to 1.5.

7. The method according to claim 5, wherein said high density plasma enhanced chemical vapor depositing process is performed on a pressure in a range from 0.5 to 2.5 torr.

8. The method according to claim 5, wherein said high density plasma enhanced chemical vapor depositing process is performed at a temperature between about 300 to 500° C.

9. The method according to claim 5, wherein said chemical vapor depositing process is performed on a radio frequency power in a range from 150 to 500 watt.

10. The method according to claim 1, wherein said dielectric liner layer is formed by a plasma enhanced chemical vapor depositing process.

11. The method according to claim 10, wherein said plasma enhanced chemical vapor depositing process using decomposition of a mixture of precursors silane ($SiH_4$) and nitrous oxide ($N_2O$) which the ratio is about 0.05 to 1.5.

12. The method according to claim 10, wherein said high density plasma enhanced chemical vapor depositing process is performed on a pressure in a range from 0.5 to 5.5 torr.

13. The method according to claim 10, wherein said high density plasma enhanced chemical vapor depositing process is performed at a temperature between about 300 to 500° C.

14. The method according to claim 10, wherein said chemical vapor depositing process is performed on a radio frequency power in a range from 50 to 1000 watt.

15. The method according to claim 1, wherein said planarizing process comprises chemical mechanical polishing (CMP) method.

16. A method for forming a high-RI intermetal dielectric layer of a semiconductor device, said method comprises:
    providing a substrate;
    depositing a patterned conductive metal layer on said substrate;
    depositing a silicon dioxide liner layer on said conductive metal layer, wherein said silicon dioxide liner layer has a high-RI between about 1.55 to 1.8;
    depositing a fluorinated silicate glass layer on said silicon dioxide liner layer; and
    performing a chemical mechanical polishing (CMP) process to planarize said fluorinated silicate glass layer and said dielectric liner layer until a top surface of said conductive layer is reached, whereby said high-RI silicon dioxide liner layer is used to reduce out diffusion of fluorine substances in said fluorinated silicate glass layer.

17. The method according to claim 16, wherein a preferred value of said RI is above 1.6.

18. The method according to claim 16, wherein said silicon dioxide liner layer is formed by a high density plasma enhanced chemical vapor depositing process.

19. The method according to claim 18, wherein said high density plasma enhanced chemical vapor depositing process using decomposition of a mixture of precursors oxygen ($O_2$) and silane ($SiH_4$) which the ratio is about 0.2 to 1.5.

20. The method according to claim 18, wherein said high density plasma enhanced chemical vapor depositing process is performed on a pressure in a range from 0.5 to 2.5 torr.

21. The method according to claim 18, wherein said high density plasma enhanced chemical vapor depositing process is performed at a temperature between about 300 to 500° C.

22. The method according to claim 18, wherein said high density plasma enhanced chemical vapor depositing process is performed on a radio frequency power in a range from 150 to 500 watt.

23. The method according to claim 16, wherein said silicon dioxide liner layer is formed by a plasma enhanced chemical vapor depositing process.

24. The method according to claim 23, wherein said plasma enhanced chemical vapor depositing process using decomposition of a mixture of precursors silane ($SiH_4$) and nitrous oxide ($N_2O$) which the ratio is about 0.05 to 1.5.

25. The method according to claim 23, wherein said high density plasma enhanced chemical vapor depositing process is performed on a pressure in a range from 0.5 to 5.5 torr.

26. The method according to claim 23, wherein said high density plasma enhanced chemical vapor depositing process is performed at a temperature between about 300 to 500° C.

27. The method according to claim 23, wherein said chemical vapor depositing process is performed on a radio frequency power in a range from 50 to 1000 watt.

28. A method for forming a high-RI intermetal dielectric layer of a semiconductor device for preventing out diffusion of fluorine substances, said method comprises:
    depositing a patterned metal layer on a substrate;
    forming a silicon dioxide liner layer by chemical vapor depositing process on said metal layer, wherein said silicon dioxide liner layer has a high-RI between about 1.55 to 1.8, and said chemical vapor depositing process is using a mixture gas;
    depositing a fluorinated silicate glass layer on said silicon dioxide liner layer; and
    performing a chemical mechanical polishing process to planarize said fluorinated silicate glass layer and said dielectric liner layer until a top surface of said conductive layer is reached, whereby said high-RI silicon dioxide liner layer is used to reduce out diffusion of fluorine substances in said fluorinated silicate glass layer.

29. The method according to claim 28, wherein a preferred value of said RI is above 1.6.

30. The method according to claim 28, wherein said chemical vapor depositing process is selected from the group consisting of a high density plasma chemical vapor depositing process and a plasma enhanced chemical vapor depositing process.

31. The method according to claim 30, wherein said high density plasma enhanced chemical vapor depositing process is performed with said mixture of precursors oxygen ($O_2$) and silane ($SiH_4$) which the ratio is about 0.2 to 1.5.

32. The method according to claim 30, wherein said high density plasma enhanced chemical vapor depositing process is performed on a pressure in a range from 0.5 to 2.5 torr.

33. The method according to claim 30, wherein said high density plasma enhanced chemical vapor depositing process is performed at a temperature between about 300 to 500° C.

34. The method according to claim 30, wherein said high density plasma enhanced chemical vapor depositing process is performed on a radio frequency power in a range from 150 to 500 watt.

35. The method according to claim 30, wherein said plasma enhanced chemical vapor depositing process is performed with said mixture of precursors silane ($SiH_4$) and nitrous oxide ($N_2O$) which the ratio is about 0.05 to 1.5.

36. The method according to claim 30, wherein said plasma enhanced chemical vapor depositing process is performed on a pressure in a range from 0.5 to 5.5 torr.

37. The method according to claim 30, wherein said plasma enhanced chemical vapor depositing process is performed at a temperature between about 300 to 500° C.

38. The method according to claim 30, wherein said plasma enhanced chemical vapor depositing process is performed on a radio frequency power in a range from 50 to 1000 watt.

* * * * *